(12) United States Patent
Carnevali

(10) Patent No.: US 9,674,975 B2
(45) Date of Patent: Jun. 6, 2017

(54) PROTECTIVE ENCLOSURE FOR TOUCH SCREEN DEVICE

(71) Applicant: Jeffrey D. Carnevali, Seattle, WA (US)

(72) Inventor: Jeffrey D. Carnevali, Seattle, WA (US)

( * ) Notice: Subject to any disclaimer, the term of this patent is extended or adjusted under 35 U.S.C. 154(b) by 0 days.

(21) Appl. No.: 13/970,920

(22) Filed: Aug. 20, 2013

(65) Prior Publication Data
US 2013/0334071 A1    Dec. 19, 2013

Related U.S. Application Data

(63) Continuation-in-part of application No. 13/763,679, filed on Feb. 10, 2013, which is a continuation-in-part of application No. 13/602,177, filed on Sep. 2, 2012, and a continuation-in-part of application No. 12/925,992, filed on Nov. 4, 2010, now Pat. No.
(Continued)

(51) Int. Cl.
| | |
|---|---|
| *B65D 85/00* | (2006.01) |
| *H05K 5/03* | (2006.01) |
| *A45C 11/00* | (2006.01) |
| *H04B 1/3888* | (2015.01) |
| *G06F 1/16* | (2006.01) |

(52) U.S. Cl.
CPC ............... *H05K 5/03* (2013.01); *A45C 11/00* (2013.01); *G06F 1/1628* (2013.01); *H04B 1/3888* (2013.01); *A45C 2011/002* (2013.01); *A45C 2011/003* (2013.01); *A45C 2200/10* (2013.01); *G06F 2200/1633* (2013.01)

(58) Field of Classification Search
CPC ....................................... H05K 5/03

USPC ............... 206/37, 701, 722, 723, 777
See application file for complete search history.

(56) References Cited

U.S. PATENT DOCUMENTS

| | | |
|---|---|---|
| 809,977 A | 1/1906 | O'Brian |
| 1,786,459 A | 7/1926 | Simons |
| | (Continued) | |

OTHER PUBLICATIONS

Otterbox Product directory, 16 pages of product description of Otter Box waterproof boxes retrieved from web site at: www.otterbox.com Otter Products, LLC, Bldg. 1 Old-Town Square, Suite 303, Fort Collins, CO 80524 Phone: 1-888-695-8820, 970-493-8446; Facsimile: 1-888-695-8827, 970-493-1755.
(Continued)

*Primary Examiner* — Fenn Mathew
*Assistant Examiner* — Don M Anderson
(74) *Attorney, Agent, or Firm* — Charles J. Rupnick

(57) ABSTRACT

A protective enclosure adapted to hold a touch screen device and allow operation of both the touch screen and actuators on a side of the device, the enclosure formed of a tray having a rim surrounding an interior device seating surface; a lid having a rim corresponding to the rim of the tray and surrounding a window aperture; a protective membrane having a transparent membrane forming an interior window portion positioned in the viewing aperture of the lid, and a resiliently pliable skirt about the interior window portion, the skirt projecting the interior window portion outwardly of the rim around the aperture of the lid; a continuous pliable seal adapted to be compressible between the corresponding rims of the lid and the tray; and a mechanism for clamping the rim of the lid and the rim of the tray with the pliable seal forming a continuous seal therebetween.

19 Claims, 5 Drawing Sheets

Related U.S. Application Data 8,701,912, which is a continuation of application No. 11/169,591, filed on Jun. 28, 2005, now Pat. No. 7,850,032, which is a continuation-in-part of application No. 11/046,567, filed on Jan. 28, 2005, now abandoned.

(56) References Cited

U.S. PATENT DOCUMENTS

| | | | | |
|---|---|---|---|---|
| 2,565,939 | A * | 8/1951 | Wriston | 220/4.23 |
| 2,717,093 | A | 9/1955 | Mautner | |
| 2,803,368 | A * | 8/1957 | Koch | 220/4.21 |
| 3,140,883 | A | 7/1964 | Anthony | |
| 3,464,579 | A | 9/1969 | Asenbauer | |
| 3,885,701 | A | 5/1975 | Becklin | |
| 3,972,459 | A | 8/1976 | Cooper | |
| 3,978,830 | A | 9/1976 | Toth, Jr. | |
| 4,298,204 | A | 11/1981 | Jinkins | |
| 4,564,880 | A * | 1/1986 | Christ et al. | 361/212 |
| 4,607,772 | A | 8/1986 | Hancock | |
| 4,828,558 | A | 5/1989 | Kelman | |
| 4,842,174 | A | 6/1989 | Sheppard et al. | |
| 4,848,319 | A | 7/1989 | Appledorn | |
| 5,002,184 | A * | 3/1991 | Lloyd | 206/305 |
| 5,096,317 | A | 3/1992 | Phillippe | |
| 5,135,189 | A | 8/1992 | Ghazizadeh | |
| 5,272,771 | A | 12/1993 | Ansell et al. | |
| 5,295,602 | A * | 3/1994 | Swanson | 220/786 |
| 5,353,934 | A * | 10/1994 | Yamauchi | 206/454 |
| 5,584,054 | A | 12/1996 | Tyneski et al. | |
| 5,586,002 | A * | 12/1996 | Notarianni | 361/679.26 |
| 5,641,065 | A | 6/1997 | Owens et al. | |
| 5,646,649 | A | 7/1997 | Iwata et al. | |
| 5,791,506 | A * | 8/1998 | Sheffler et al. | 215/345 |
| 5,813,096 | A | 9/1998 | Soennichsen | |
| 5,842,670 | A | 12/1998 | Nigoghosian | |
| 5,845,885 | A | 12/1998 | Carnevali | |
| 5,953,795 | A | 9/1999 | Bauer | |
| 5,969,057 | A | 10/1999 | Schoeley et al. | |
| 5,990,874 | A * | 11/1999 | Tsumura et al. | 345/173 |
| 6,009,601 | A | 1/2000 | Kaufman | |
| 6,032,910 | A | 3/2000 | Richter | |
| 6,035,800 | A * | 3/2000 | Clifford | 114/347 |
| 6,068,119 | A * | 5/2000 | Derr et al. | 206/305 |
| 6,273,773 | B1 | 8/2001 | Bourke | |
| 6,276,552 | B1 * | 8/2001 | Vervisch | 220/324 |
| 6,295,198 | B1 | 9/2001 | Loh et al. | |
| 6,406,758 | B1 | 6/2002 | Bottari et al. | |
| 6,407,860 | B1 | 6/2002 | Funazaki et al. | |
| 6,585,212 | B2 | 7/2003 | Carnevali | |
| 6,614,423 | B1 | 9/2003 | Wong et al. | |
| 6,646,864 | B2 * | 11/2003 | Richardson | 361/679.3 |
| 6,648,376 | B2 | 11/2003 | Christianson | |
| 6,785,566 | B1 * | 8/2004 | Irizarry | 455/575.8 |
| 6,842,171 | B2 | 1/2005 | Richter et al. | |
| 6,953,126 | B2 * | 10/2005 | Parker et al. | 220/4.22 |
| 6,984,680 | B2 | 1/2006 | Quinn | |
| 6,995,976 | B2 | 2/2006 | Richardson | |
| 7,031,148 | B1 | 4/2006 | Lin | |
| 7,158,376 | B2 | 1/2007 | Richardson et al. | |
| 7,464,814 | B2 * | 12/2008 | Carnevali | 206/320 |
| 7,520,389 | B2 * | 4/2009 | Lalouette | 206/722 |
| 7,594,576 | B2 * | 9/2009 | Chen et al. | 206/320 |
| 7,850,032 | B2 * | 12/2010 | Carnevali et al. | 220/4.22 |
| 8,453,835 | B2 * | 6/2013 | So | 206/320 |
| 2004/0108348 | A1 | 6/2004 | Barnes | |
| 2005/0189354 | A1 | 9/2005 | Heather et al. | |
| 2012/0043235 | A1 * | 2/2012 | Klement | 206/320 |
| 2012/0118773 | A1 * | 5/2012 | Rayner | 206/320 |
| 2012/0211382 | A1 * | 8/2012 | Rayner | 206/320 |
| 2012/0250270 | A1 * | 10/2012 | Liu | 361/752 |
| 2012/0261306 | A1 * | 10/2012 | Richardson et al. | 206/778 |
| 2012/0298536 | A1 * | 11/2012 | Rauta et al. | 206/301 |
| 2013/0092576 | A1 * | 4/2013 | Rayner | 206/320 |
| 2013/0193006 | A1 * | 8/2013 | Bergreen et al. | 206/37 |
| 2013/0220841 | A1 * | 8/2013 | Yang | 206/37 |

OTHER PUBLICATIONS

Officeonthego.com, 3 pages of product description of Manifico PLUS screen magnifier product information retrieved from web site at: www.officeonthego.com.

2 pages of product information for Armor 1600 and Armor 1601 waterproof, dustproof and airtight protective cases.

2 pages Otterbox 4600 Tablet PC Case protective cases product information retrieved from web site at: www.otterbox.com.

* cited by examiner

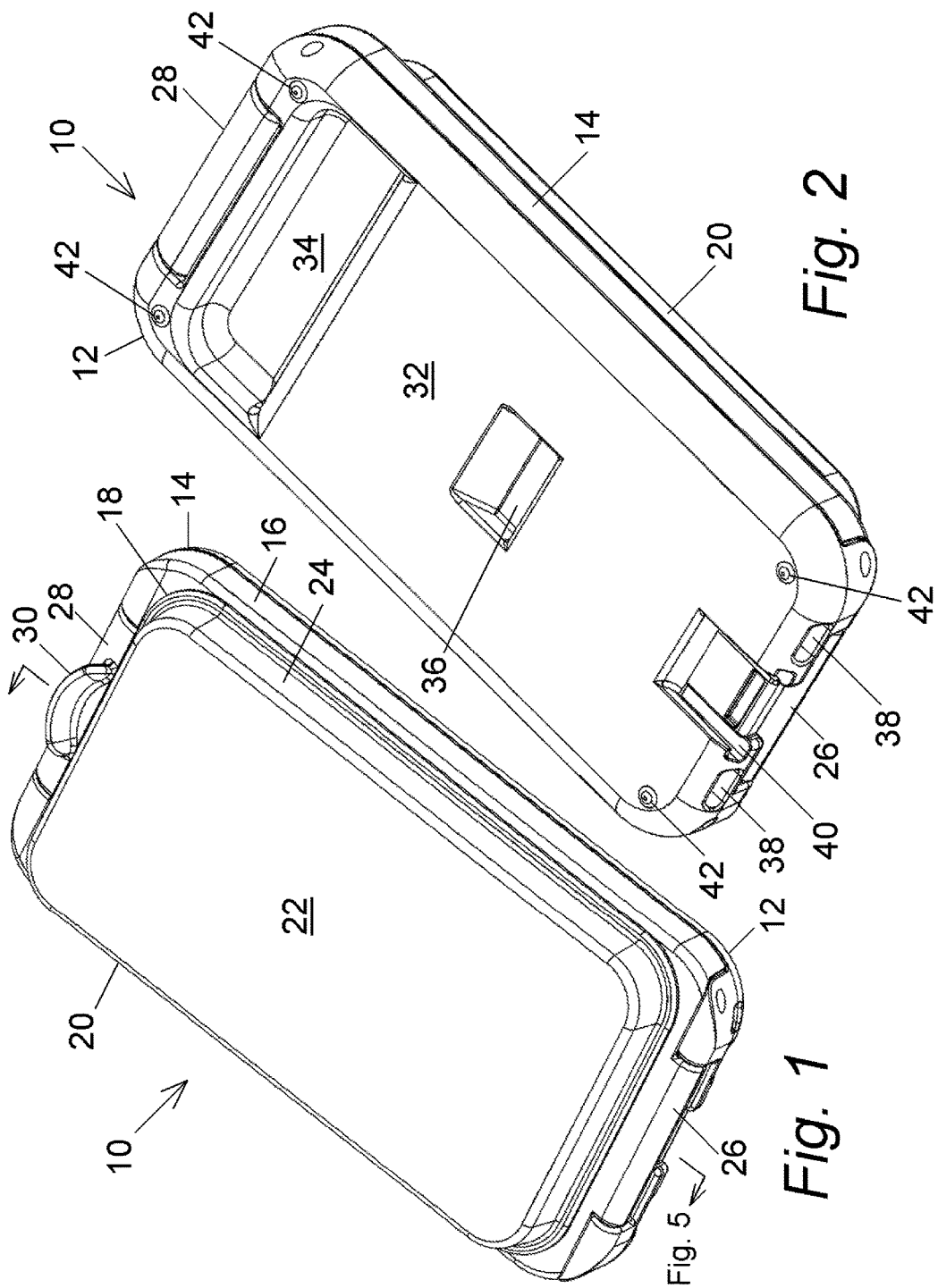

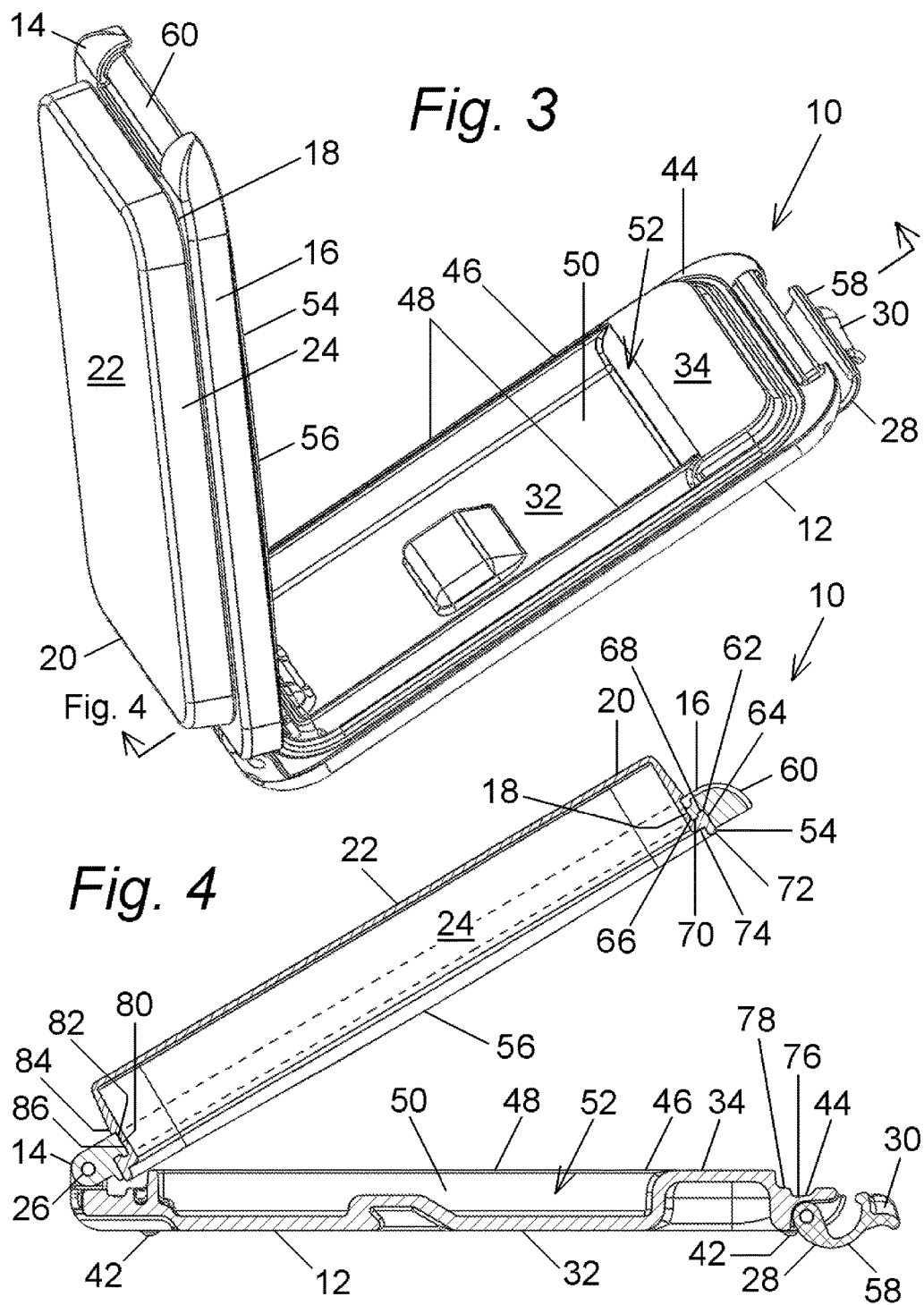

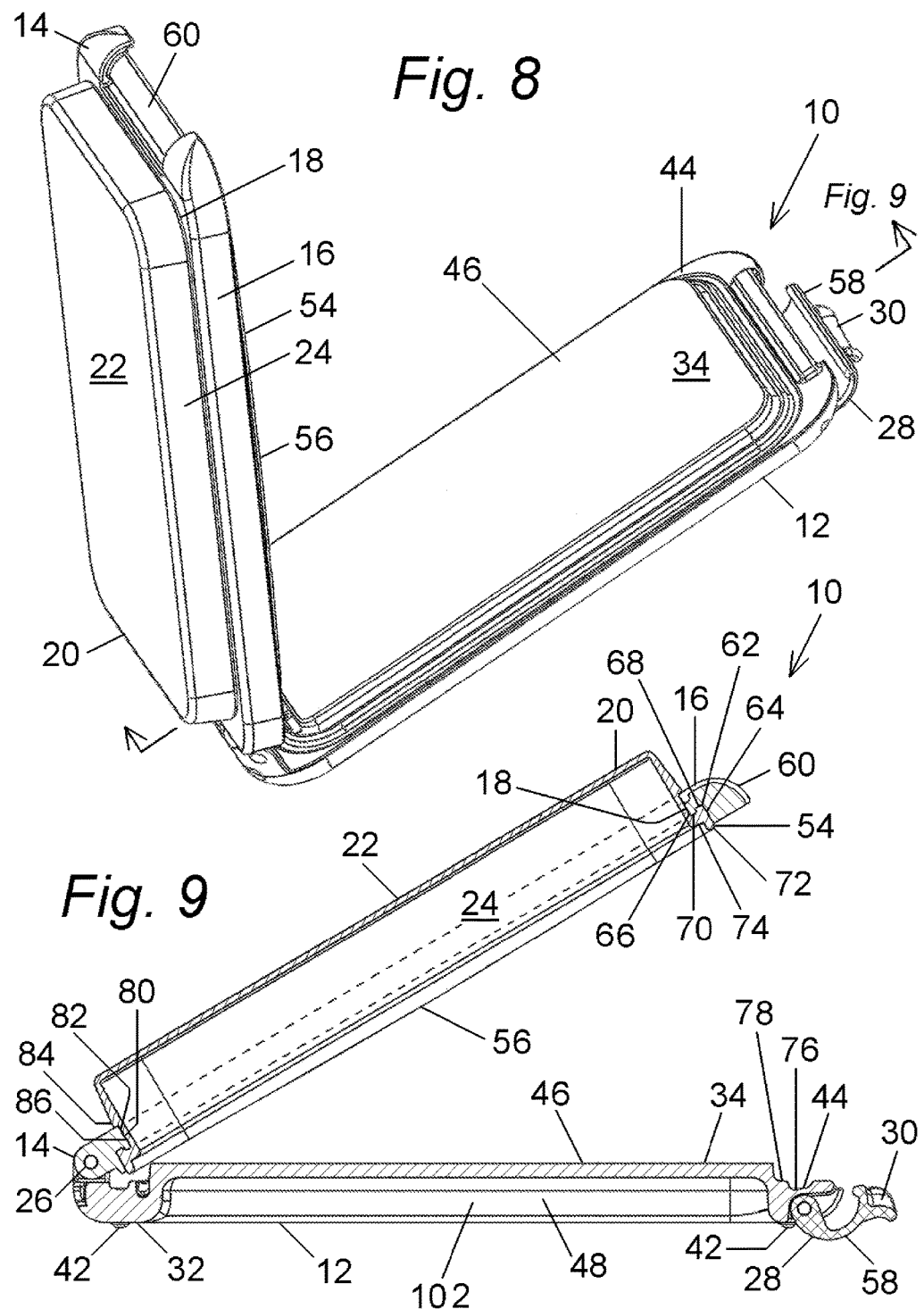

PROTECTIVE ENCLOSURE FOR TOUCH SCREEN DEVICE

This application is a Continuation-in-part of co-pending U.S. patent application Ser. No. 13/763,679 entitled "Protective Enclosure For Touch Screen Device" filed in the name of the same inventor hereof on 10 Feb. 2013, which is a Continuation-in-part of co-pending U.S. patent application Ser. No. 13/602,177 entitled "Protective Enclosure for Touch Screen Device" filed in the name of the same inventor hereof on 2 Sep. 2012, which is a Continuation-in-part of co-pending U.S. patent application Ser. No. 12/925,992 entitled "Sealed Window for Dry Box" filed in the name of the same inventor hereof on 4 Nov. 2010, which references are incorporated herein by reference.

FIELD OF THE INVENTION

The present invention relates to a dry storage box having a window panel in window aperture arranged for viewing a cavity formed within the box, and in particular to a substantially water-resistant sealing mechanism for sealing the window panel relative to the window aperture, wherein the window panel is a membrane adapted to allow operation of a touch screen interface of an electronic device is disposed in the dry storage box.

BACKGROUND OF THE INVENTION

Dry storage boxes are generally well known, including protective cases for electronic devices having a touch screen on the front surface of its case. These protective cases provide a window membrane adapted to the specific contour and profile of the electronic device that allows the user to operate the touch screen interface.

However, known protective cases for touch screen devices are limited in their ability to provide complete access to operate the touch screen device efficiently and reliably.

SUMMARY OF THE INVENTION

The present invention is a protective enclosure for a device responsive to a tactile stimulus, i.e., an electronic device having a touch screen interface on the front surface of its case, and one or more buttons and/or switches or other actuators as part of the user interface and positioned on a side portion of the case, e.g., for powering the touch screen device and controlling other various functions thereof.

According to one aspect of the invention, the protective enclosure includes a tray forming an interior device seating area and a rim around the device seating area, wherein the tray is adapted for receiving the device on the device seating area and oriented with a portion thereof that is responsive to a tactile input facing away from the device seating area; and a lid that is movable relative to the device seating area of the tray between an open position and a closed position. The lid includes a rim around an aperture, with the aperture positioned for viewing an interior portion of the enclosure there through, and a substantially transparent pliable membrane positioned in the viewing aperture of the lid, wherein the membrane is formed with an interior window portion that is projected outwardly of the rim around the aperture of the lid. A continuous pliable seal is positioned between the rim of the lid and the rim of the tray when the lid is in the closed position relative to the tray. The enclosure forms a protective case portion adapted to hold the touch screen device and allowing operation of the touch screen and of one or more actuators on a side of the touch screen device.

According to another aspect of the invention, the membrane of the protective enclosure further includes a skirt portion extended between the interior window portion thereof and the rim of the lid.

According to another aspect of the invention, the membrane of the protective enclosure further includes the pliable seal.

According to another aspect of the invention, the device seating area of the tray is further projected outwardly of the rim thereof.

According to another aspect of the invention, the lid of the protective enclosure is further hinged relative to the device seating area of the tray for moving between an open position and a closed position. Additionally, a clamping mechanism is structured for clamping the pliable seal between the rim of the lid and the rim of the tray for clamping the pliable seal between the rim of the lid and the rim of the tray in a continuous substantially water-resistant seal.

Other aspects of the invention are detailed herein.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a perspective view showing an example of the protective enclosure of the invention for a touch screen device responsive to a tactile stimulus;

FIG. 2 illustrates a backside of the protective enclosure illustrated in FIG. 1;

FIG. 3 illustrates the protective enclosure illustrated in FIG. 1 in an open position for receiving an iPhone or other touch screen device;

FIG. 4 is a cross-section lengthwise through the protective enclosure illustrated in FIG. 1;

FIG. 8 and FIG. 9 together illustrate the protective enclosure illustrated in FIG. 1 wherein an interior cavity of the tray is eliminated.

DETAILED DESCRIPTION OF PREFERRED EMBODIMENT

Figure 5:
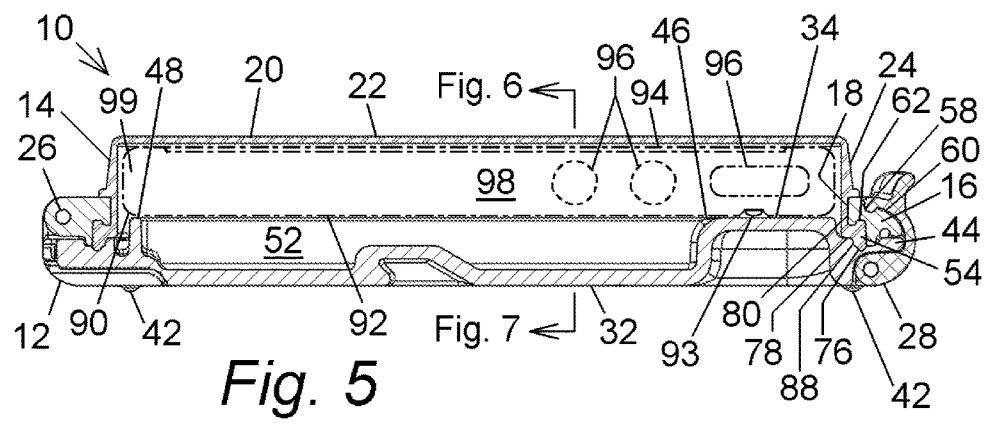
FIG. 5 illustrates the protective enclosure illustrated in FIG. 1 having means for forming a continuous compression seal between a peripheral rim of a lid and a peripheral rim of a tray when the lid is latched in the closed position relative to the tray.

As required, a detailed illustrative embodiment of the present protective enclosure is disclosed herein. However, techniques, systems and operating structures in accordance with the present protective enclosure may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein which define the scope of the present protective enclosure. The following presents a detailed description of an illustrative embodiment (as well as some alternative embodiments) of the present protective enclosure.

In the Figures, like numerals indicate like elements.

FIG. 1 illustrates a protective enclosure 10 for a device responsive to a tactile stimulus. Protective enclosure 10 allows operation of the device while the device is disposed therein.

Protective enclosure 10 includes a substantially rigid tray 12 with a lid 14 that is movable relative to tray 12. Lid 14 has a substantially rigid rim 16 around a viewing aperture 18 that is positioned for viewing an interior portion of enclosure 10 therethrough. A substantially transparent pliable membrane 20 is positioned in viewing aperture 18 of lid 14. Polyvinylchloride is a useful material for membrane 20. Membrane 20 is also a transmissive membrane adapted to allow sound to pass therethrough with a minimum of distortion. Membrane 20 may be constructed by injection molding or other methods. Alternative materials and methods of construction may be used by those skilled in the art to achieve the same results while maintaining within the spirit and intent of the present invention. Protective enclosure 10 is thus adapted to hold the device and allows viewing of the device as well as allowing tactile stimulus to be input thereto through pliable membrane 20. For example, protective enclosure 10 is thus adapted to hold a touch screen device, such as a cellular telephone or iPhone for example available from Apple Inc., Cupertino, Calif. 95014, and allows both viewing of the touch screen device and input of tactile stimulus to the touch screen device through pliable membrane 20.

Pliable membrane 20 permits tactile stimulation of the touch screen on a front surface of the device case as well as operation of one or more actuators on a side of the touch screen device. For example, an interior window portion 22 of membrane 20 is projected outwardly of viewing aperture rim 16 by a pliable skirt portion 24 of membrane 20 that is extended from between lid rim 16 and membrane interior window portion 22. Interior window portion 22 of membrane 20 is substantially transparent and pliable, whereby membrane interior portion 22 is adapted to allow tactile stimuli to be communicated to a touch screen exposed on a front surface of the device case. Pliable skirt portion 24 of membrane 20 is extended between interior window portion 22 and skirt portion 24. Membrane pliable skirt portion 24 is adapted to allow tactile inputs to be communicated to one or more actuators on the sides and end portions of the device case that are spaced below the front surface of the touch screen device. Pliable skirt portion 24 of membrane 20 is substantially transparent to permit viewing of actuators on the sides and end portions of the touch screen device case.

Lid 14 is movable relative to tray 12 by a hinge 26 along one end of protective enclosure 10, and a clamping mechanism 28 is structured for clamping a pliable seal between rim 16 of lid 14 and tray 12 in a continuous substantially water-resistant seal. Clamping mechanism 28 is operable, for example, by a handle 30.

FIG. 2 illustrates a backside of protective enclosure 10, wherein a base portion 32 of tray 12 has means for lifting the iPhone or other touch screen device toward interior window portion 22 of membrane 20 between side skirt portion 24, whereby actuators on the sides and end portions of the device case are positioned near pliable side skirt portion 24 for actuation therethrough. For example, tray base portion 32 is formed with one (or more) window spacer 34 projected toward lid 14 of enclosure 10.

Substantially rigid tray 12 is optionally formed by molding using a substantially transparent material, whereby a camera lens or other video capture device in a back surface of the iPhone or other touch screen device has a substantially unimpeded view through tray base portion 32. For example, material for tray 12 may be selected to be clear plastic, such as polycarbonate. Through the air communications, such as infrared and over the air radio frequency (RF) communications may pass through protective enclosure 10. Appropriate selection of material for tray 12 can thereby enable various RF transmissions, such as cellular phone communications or other wireless communication protocols while protective enclosure 10 is closed. Alternatively, a substantially transparent window is provided in tray base portion 32 in a position to accommodate such camera lens. For example, spacer 34 is formed of a substantially transparent material for operating as a window in tray base portion 32. Accordingly, window spacer 34 is positioned adjacent to such camera lens of the touch screen device for minimizing visual distortion therethrough.

Optionally, tray base portion 32 is also formed with an indent 36 that cooperates with one or more additional indents 38 for securing a belt clip or other mechanism for carrying protective enclosure 10 on a user's person or mounting on a holder. Other alternative mounting structures 40 may be provided for securing such a belt clip or other carrying or mounting mechanism. One or more buttons or feet 42 may be formed on tray base portion 32 for spacing enclosure 10 off of a surface, such as a table or desk.

FIG. 3 illustrates protective enclosure 10 in an open position for receiving the iPhone or other touch screen device thereinto, or for removing the device therefrom.

Tray 12 is formed with a peripheral rim 44 surrounding an interior device seating surface 46 in a position spaced above tray peripheral rim 44. For example, interior device seating surface 46 is formed by window spacer 34 in combination with one or more interior spacer walls 48 within surrounding peripheral rim 44 and substantially parallel with camera window spacer 34. Accordingly, interior device seating surface 46 is structured for spacing the touch screen device away from tray base portion 32 and outwardly of tray rim 44. Interior device seating surface 46 thus spaces touch screen device outwardly of peripheral rim 44 in a position that, when lid 14 is in the closed position relative to tray 12, actuators on sides or end portions of the touch screen device case are viewable through pliable skirt portion 24 of membrane 20 and also may be manipulated therethrough.

Optionally, tray 12 is formed with an opening 50 into an interior cavity 52 formed between window spacer 34 and interior spacer walls 48 of device seating surface 46.

A continuous pliable seal 54 is positioned between peripheral rim 16 of lid 14 and peripheral rim 44 of tray 12. When lid 14 is in the closed position relative to tray 12, pliable seal 54 is compressed between substantially rigid rim 16 of lid 14 and substantially rigid peripheral rim 44 of tray 12 for forming a continuous substantially water-resistant seal around the touch screen device within protective enclosure 10, as disclosed herein. Optionally, seal 54 is formed with a preload portion 56 that expands evenly between hinge and clamping ends of lid rim 14 to a peak (at 56) thickness near the midpoint of lid rim 14, as more clearly illustrated in FIG. 4.

Clamping mechanism 28 is more clearly shown here as having a clasp 58 hingedly coupled to tray 12 opposite from lid hinge 26, and a cooperating catch 60 formed in rim 16 of lid 14. Clasp 58 and catch 60 of clamping mechanism 28 thus cooperate to latch lid 14 in the closed position relative to tray 12.

FIG. 4 is a cross-section lengthwise through protective enclosure 10, and more clearly illustrates seal 54 being formed with preload portion 56 that expands evenly between hinge and clamping ends of lid rim 14 to a peak (at 56) thickness near the midpoint of lid rim 14. Preload portion 56 thickening toward the center of seal 54 between lengthwise ends of lid rim 16 effectively improve sealing power by providing extra seal material in the area that may bend from the pressure of compressing seal 54 against rim 44 of tray 12. The additional material provided by preload portion 56 insures that seal 54 will form a continuous substantially water-resistant seal between rim 16 of lid 14 and tray 12.

Seal 54 is illustrated here by example and without limitation as being an extension of pliable membrane 20. Accordingly, substantially transparent pliable membrane 20 is a single, one-piece unit that includes: continuous pliable seal portion 54, substantially transparent pliable interior window portion 22 that is adapted to allow tactile inputs to be communicated to the touch screen of the device in protective enclosure 10, and substantially transparent pliable skirt portion 24 that is extended from interior window portion 22 and is adapted to allow tactile inputs to be communicated to one or more actuators on sides and/or ends of the touch screen device case.

Rim 16 of lid 14 is structured with seal retention means 62 for retaining seal portion 54 of membrane 20 adjacent to viewing aperture 18. Seal retention means 62 is formed in lid rim 16 completely surrounding viewing aperture 18. Seal retention means 62 is formed as a first contact surface 64 defining a first circumferential barrier formed as a groove extending around the circumference of viewing aperture 18 of lid 14, and a second contact surface 66 disposed adjacent to first contact surface 64, second contact surface defining a second circumferential barrier formed as a ridge aligned with first circumferential barrier groove 64.

By example and without limitation, peripheral seal portion 54 is disposed along the entire circumference of flexible membrane 20 at edge of pliable skirt portion 24 opposite from membrane interior window portion 22, wherein peripheral seal portion 54 of flexible membrane 20 is formed as a sealing lip of an increased thickness of flexible membrane 20 relative to membrane skirt portion 24 and interior window portion 22. Peripheral sealing lip portion 54 of membrane 20 is configured and arranged to be at least partially disposed within first circumferential barrier 64 to form a water-resistant seal. For example, membrane peripheral sealing lip portion 54 includes a first contact surface 68 defining a first circumferential barrier formed as a ridge extending around the circumference of membrane skirt portion 24, which is sized and arranged to be at least partially received into first circumferential barrier groove 64 of lid rim 16 entirely around circumference of viewing aperture 18 of lid 14. Peripheral sealing lip portion 54 of membrane 20 is further configured and arranged to receive rim 16 of lid 14 at least partially thereinto. For example, membrane peripheral sealing lip portion 54 includes a second contact surface 70 defining a groove extending around the circumference of membrane skirt portion 24, which is sized and arranged to receive thereinto second circumferential barrier ridge 66 of lid rim 16 entirely around circumference of viewing aperture 18 of lid 14.

Additionally, peripheral sealing lip portion 54 of flexible membrane 20 is configured and arranged to form a water-resistant seal between peripheral rim 16 of lid 14 and peripheral rim 44 of tray 12. Peripheral rim 44 of tray 12 is configured and arranged to cooperate with seal retention means 62 of lid rim 16 for at least partially compressing pliable seal 54 of membrane 20 therebetween for forming a continuous substantially water-resistant seal around the touch screen device within protective enclosure 10, as disclosed herein.

By example and without limitation, peripheral sealing lip portion 54 of flexible membrane 20 is formed with a third contact surface 72 defining a first circumferential compression interface formed as a ridge extending around the circumference of membrane skirt portion 24 and extending therefrom entirely around circumference of rim 16 of lid 14. Peripheral sealing lip portion 54 of flexible membrane 20 is further formed with a fourth contact surface 74 disposed adjacent to third contact surface 72 and defining a second circumferential compression interface formed as a flat surface aligned within first circumferential compression interface ridge 72.

By example and without limitation, peripheral rim 44 of tray 12 is formed with a first contact surface 76 defining a first circumferential compression barrier formed as a groove extending around the circumference of tray peripheral rim 44, and a second contact surface 78 disposed adjacent to first contact surface 76, second contact surface defining a second circumferential compression barrier formed as a flat surface aligned within first circumferential barrier groove 76.

Peripheral first circumferential compression barrier groove 76 of tray rim 44 is sized and arranged to at least partially receive compressively thereinto first circumferential compression interface ridge 72 of peripheral sealing lip portion 54 of membrane 20 to form a continuous water-resistant seal between peripheral rim 16 of lid 14 and peripheral rim 44 of tray 12. Furthermore, peripheral second circumferential compression barrier flat contact surface 78 is further sized and arranged within first circumferential barrier groove 76 to at least partially receive compressively there against second circumferential compression interface flat surface 74 of peripheral sealing lip portion 54 of membrane 20 to form a continuous water-resistant seal between peripheral rim 16 of lid 14 and peripheral rim 44 of tray 12.

Peripheral sealing lip portion 54 of flexible membrane 20 optionally includes membrane positioning means 80 for positioning membrane 20 in viewing aperture 18. By example and without limitation, membrane peripheral sealing lip portion 54 is formed with a circumferential groove 82 and lip 84 fit over an inner peripheral ledge 86 of lid peripheral rim 16 within viewing aperture 18.

As disclosed herein, membrane 20 is easily removed from engagement with viewing aperture 18 in lid 14 and replaced with a new membrane if necessary by disengaging membrane positioning means 80, and disengaging seal retention means 62 that retains seal portion 54 of membrane 20 adjacent to viewing aperture 18. Thereafter, membrane 20 is removed from viewing aperture 18, and a replacement membrane 20 is installed in reverse.

FIG. 5 illustrates protective enclosure 10 having means for forming a continuous compression seal 88 between peripheral rim 16 of lid 14 and peripheral rim 44 of tray 12 when lid 14 is in the closed position relative to tray 12 and latched therein by clamping mechanism 28. Continuous compression seal 88 is formed of peripheral sealing lip portion 54 of membrane 20 being compressed between peripheral rim 16 of lid 14 and peripheral rim 44 of tray 12 by engagement of clamping mechanism 28. Continuous compression seal 88 is formed of first circumferential compression interface ridge 72 of peripheral sealing lip portion 54 of flexible membrane 20 being compressed against first circumferential compression barrier groove 76 of rim 44 of tray 12, and is further formed of second circumferential compression interface flat surface 74 of peripheral sealing lip portion 54 of membrane 20 being compressed against second circumferential compression barrier flat contact surface 78 of rim 44 of tray 12.

FIG. 5 further illustrates protective enclosure 10 having a touch screen device 90, such as a cellular telephone or iPhone, shown in phantom lines, disposed therewithin with a back portion 92 thereof resting on window spacer 34 and interior spacer walls 48 of interior device seating surface 46. A camera lens 93 positioned on back portion 92 of device 90 is positioned adjacent to window spacer 34 at least a portion of which is substantially transparent for permitting photographic images to be shot therethrough.

A touch screen portion 94 thereof responsive to a tactile stimulus is positioned upwardly facing toward and close proximity to interior window portion 22 of membrane 20. Touch screen portion 94 of touch screen device 90 is responsive to a tactile stimulus input through interior window portion 22 of membrane 20.

One or more buttons and/or switches or other actuators 96 as part of the user interface. These actuators 96 are typically positioned on a side portion 98 of case 99 of touch screen device 90 for powering touch screen device 90 and controlling other various functions thereof. The size, layout, and function of actuators 96 may vary for different manufacturers and models of touch screen device 90.

Side portions 98 of touch screen device case 99 are elevated into approximate alignment with substantially transparent pliable skirt portion 24 of membrane 20 by seating of touch screen device 90 on interior device seating surface 46 of tray 12. Furthermore, interior device seating surface 46 of tray 12 spaces touch screen device case 99 such that peripheral rim 16 of lid 14 is arranged so as to not interfere with operation of button and/or switch actuators 96 positioned on side portion 98 of case 99.

Actuators 96 of touch screen device 90 are raised outwardly of tray 12 above rim 16 of lid 14 into a position approximately aligned with substantially transparent pliable skirt portion 24 of membrane 20 so as to be accessible to a tactile stimulus input through pliable skirt portion 24. Furthermore, skirt portion 24 of membrane 20 is substantially transparent for viewing therethrough of actuators 96 positioned on side portion 98 of case 99, and is substantially pliable for operating actuators 96 therethrough, i.e., enabling the user to more easily deflect membrane skirt portion 24 over actuators 96. Accordingly, operator of touch screen device 90 is not required to open lid 14 and remove touch screen device 90 from protective enclosure 10 for powering and otherwise controlling touch screen device 90 via actuators 96 on side portion 98 of case 99.

Figure 6:
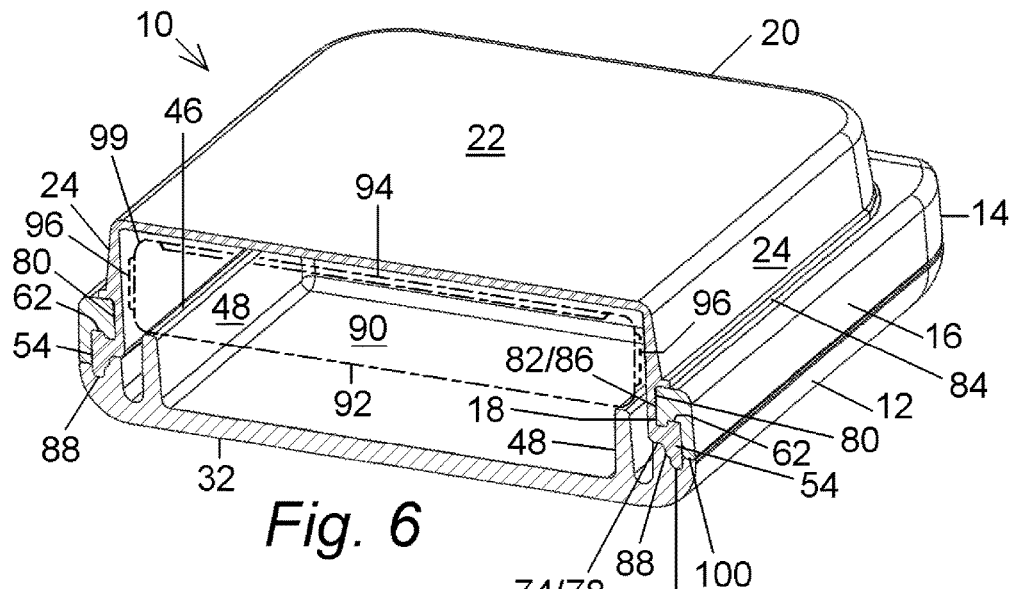
FIG. 6 is a cross-section of the protective enclosure illustrated in FIG. 1 that more clearly illustrates means for retaining a seal portion of a protective membrane adjacent to a viewing aperture of the lid.

FIG. 6 is a cross-section that more clearly illustrates seal retention means 62 for retaining seal portion 54 of membrane 20 adjacent to viewing aperture 18. Also more clearly illustrated here is membrane positioning means 80 for positioning peripheral sealing lip portion 54 of flexible membrane 20 in viewing aperture 18, and continuous compression seal 88 adjacent to junction 100 of peripheral rim 16 of lid 14 and peripheral rim 44 of tray 12 when lid 14 is in the closed position relative to tray 12 and latched therein by clamping mechanism 28.

Figure 7:
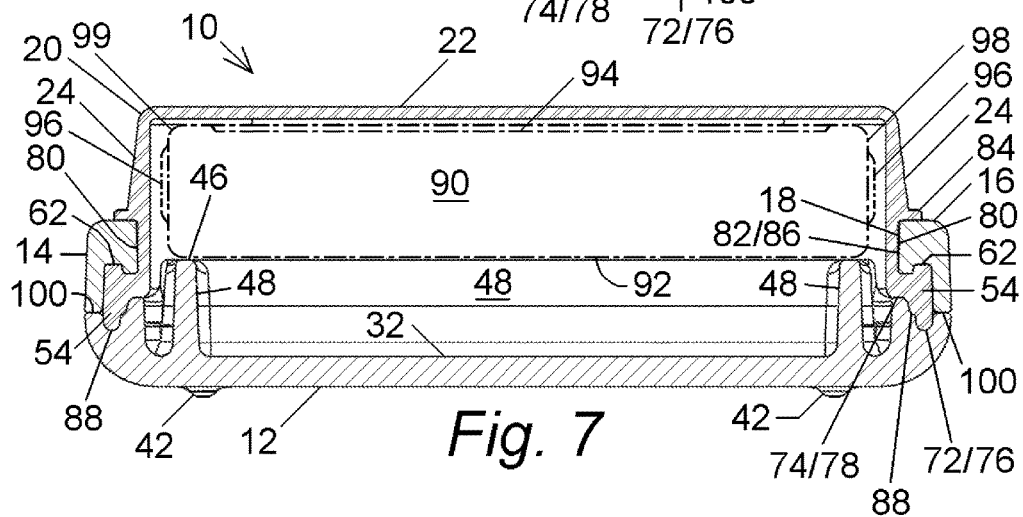
FIG. 7 is another cross-section of the protective enclosure illustrated in FIG. 1 that more clearly illustrates means for retaining a seal portion of a protective membrane adjacent to a viewing aperture of the lid.

FIG. 7 is another cross-section that clearly illustrates seal retention means 62 for retaining seal portion 54 of membrane 20 adjacent to viewing aperture 18. Also more clearly illustrated here is membrane positioning means 80 for positioning peripheral sealing lip portion 54 of flexible membrane 20 in viewing aperture 18, and continuous compression seal 88 adjacent to junction 100 of peripheral rim 16 of lid 14 and peripheral rim 44 of tray 12 when lid 14 is in the closed position relative to tray 12 and latched therein by clamping mechanism 28.

FIG. 8 and FIG. 9 together illustrate protective enclosure 10 wherein interior cavity 52 is eliminated. Protective enclosure 10 is otherwise substantially the same as illustrated in FIGS. 1-7 herein. Here, window spacer 34 is substantially continuous along interior spacer walls 48 and forms interior device seating surface 46 for spacing the touch screen device away from tray base portion 32 and outwardly of tray rim 44 in a position that, when lid 14 is in the closed position relative to tray 12, actuators on sides or end portions of the touch screen device case are viewable through pliable skirt portion 24 of membrane 20 and also may be manipulated therethrough. Optionally, a space 102 is formed underneath interior device seating surface 46, but this is not necessary to the function of protective enclosure 10 and interior device seating surface 46.

Alternative Embodiments

Figure 10:
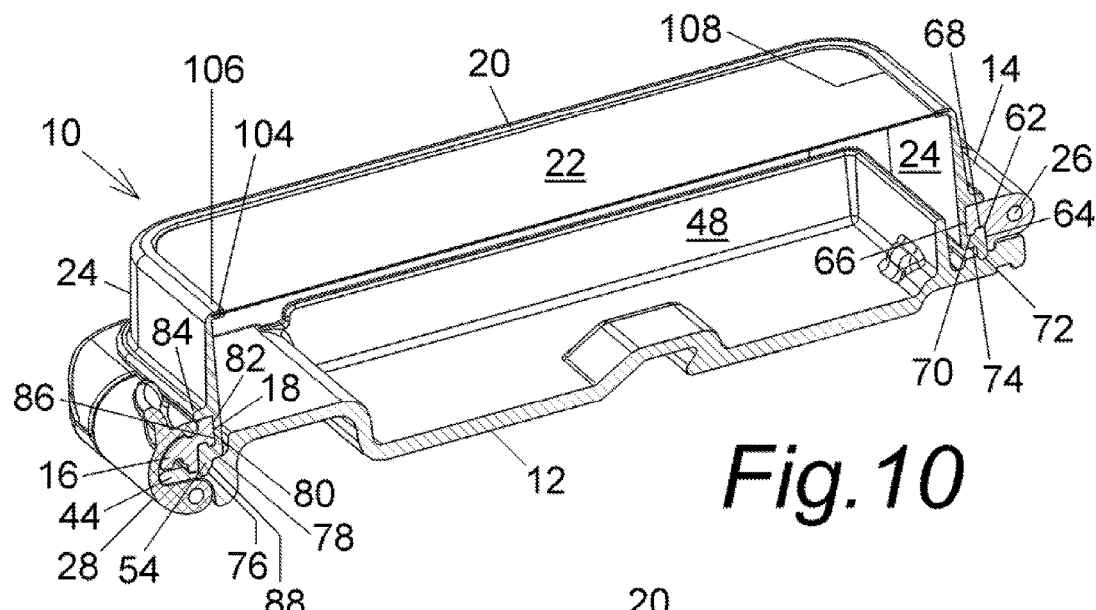
FIG. 10 and FIG. 11 together illustrate the protective enclosure illustrated in FIG. 1 wherein a hard transparent plastic sheet forms the viewing aperture of the lid surrounded by a pliable skirt portion including the seal portion of the protective membrane.
Figure 11:
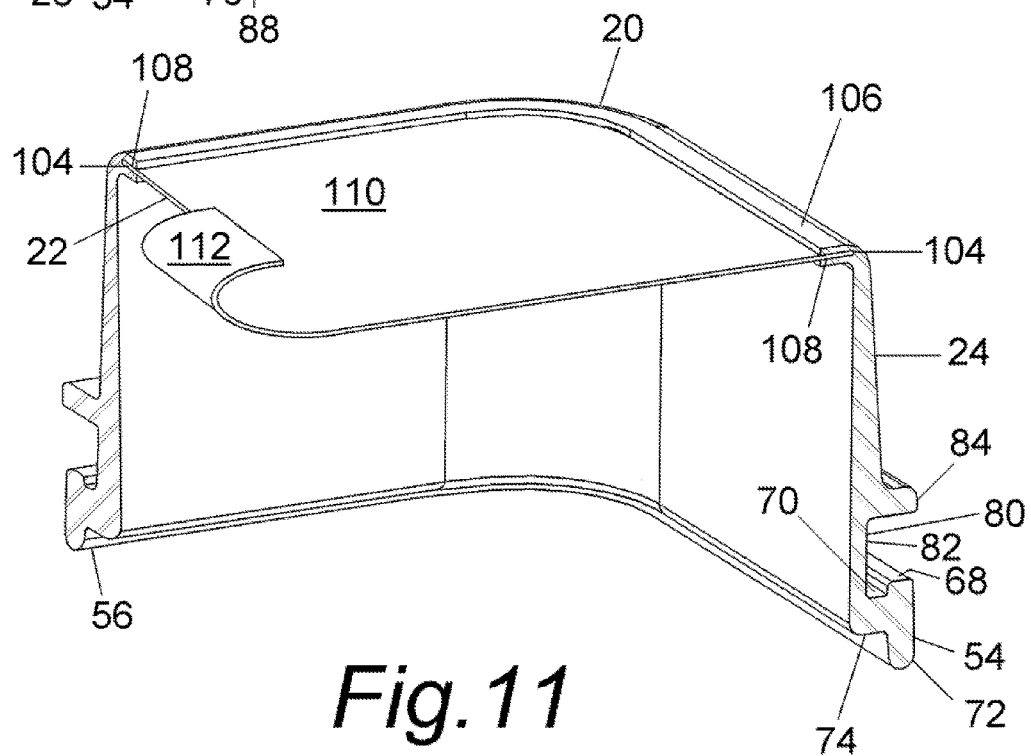

FIG. 10 and FIG. 11 together illustrate protective enclosure 10 for a device responsive to a tactile stimulus illustrated in FIG. 1, wherein FIG. 10 is a cross-section lengthwise through enclosure 10, and FIG. 11 is a partial section view of membrane 20 of lid 14. In FIGS. 10 and 11, protective membrane 20 of lid 14 is a two-part member including a substantially transparent, hard, inelastic and noncompressible plastic sheet component forming interior window portion 22 of membrane 20, and a molded component forming resiliently pliable skirt portion 24 of a soft and compressible material surrounding transparent hard plastic sheet component of interior window portion 22. Optionally, soft, pliable and compressible skirt portion 24 forms a substantially watertight seal with hard, inelastic and noncompressible interior window portion 22.

For example, the plastic sheet component forming interior window portion 22 of membrane 20 is optionally a noncompressible sheet of relatively hard and substantially visually transparent material, including but not limited to polyethylene terephthalate (PET) or another suitable substantially visually transparent material. According to one embodiment, the plastic sheet component forming interior window portion 22 of membrane 20 is optionally a noncompressible sheet of relatively hard and substantially visually transparent polyvinyl chloride (PVC) material.

As disclosed herein, membrane 20 having PET or PVC or other hard, noncompressible and inelastic plastic sheet component of interior window portion 22 similarly permits tactile stimulation of the touch screen on a front surface of the device case, as well as operation of one or more actuators on a side of the touch screen device. Plastic interior window portion 22 of membrane 20 is projected outwardly of viewing aperture rim 16 by pliable skirt portion 24 of membrane 20 that is extended from between lid rim 16 and membrane interior window portion 22. According to one embodiment, plastic interior window portion 22 of membrane 20 is a noncompressible sheet of thin plastic film that is substantially transparent for viewing interior portion of enclosure 10 therethrough and is further adapted to allow tactile stimuli to be communicated to touch screen 94 exposed on a front surface of touch screen device 90 installed in enclosure 10. For example, noncompressible sheet component is sufficiently thin to permit interior window portion 22 to flex enough for user's digits to contact touch screen portion 94 of device 90 therethrough, and further, to transmit a tactile stimulus therethrough to touch screen portion 94 for registering a tactile input for effecting a response from touch screen device 90 without damage to interior window portion 22. Noncompressible plastic sheet component of interior window portion 22 is optionally a sheet of substantially transparent thin, hard plastic film material in the range of about 0.003 to 0.010 inch thick which has been determined to effectively allow tactile stimuli to be communicated to touch screen 94 of touch screen device 90 installed in enclosure 10, without damage to interior window portion 22. According to one embodiment, noncompressible plastic sheet component of interior window portion 22 is optionally in the range of about 0.004 to 0.005 inch thick. Noncompressible plastic sheet component of interior window portion 22 is surrounded by resiliently pliable skirt portion 24 including seal portion 54 of protective membrane 20. Skirt portion 24 is joined to a peripheral edge portion 104 of interior window portion 22 of protective membrane 20, optionally forming a substantially continuous watertight seal therewith.

Pliable skirt portion 24 of membrane 20 is extended between interior window portion 22 and skirt portion 24. Membrane pliable skirt portion 24 is molded of a suitable resiliently pliable, soft and compressible material in a manner to allow tactile inputs to be communicated to one or more actuators 96 on sides and/or end portions 98 of device case 99 that are spaced below touch screen 94 of touch screen device 90. When interior window portion 22 of membrane 20 is a noncompressible sheet of relatively hard and substantially visually transparent PET or PVC or other suitable material, pliable skirt portion 24 is optionally molded of any melt processable thermoplastic elastomer that is compatible with the material of interior window portion 22, including but not limited to polyvinyl chloride (PVC) or silicone or thermoplastic rubber (TPR) or thermoplastic elastomer (TPE) or another suitable compatible material. Pliable skirt portion 24 of membrane 20 is optionally adapted to permit viewing of actuators 96 on sides and end portions 98 of case 99 of touch screen device 90. For example, pliable skirt portion 24 of membrane 20 is optionally substantially visually transparent for viewing interior portion of enclosure 10 therethrough.

By example and without limitation, pliable skirt portion 24 of protective membrane 20 is joined to peripheral edge portion 104 interior window portion 22 by over-molding therewith, for example, by injection molding skirt portion 24 with sheet component of interior window portion 22 thereby forming a circumferential wall coupled to peripheral edge portion 104 thereof. Alternatively, skirt portion 24 of protective membrane 20 is joined to peripheral edge portion 104 of interior window portion 22 by another suitable manufacturing method, including but not limited to ultra-sonic or chemical welding, adhesive bonding, or other suitable bonding process during formation of skirt portion 24. Optionally, the joining technique forms the optional substantially continuous watertight seal 108 of skirt portion 24 with edge portion 104 of interior window portion 22.

Pliable skirt portion 24 thus forms a thick, soft and flexible frame portion 106 of protective membrane 20 that is overlapping and substantially continuous with thin, hard and noncompressible plastic interior window portion 22 thereof. Overmolding, ultra-sonic or chemical welding, adhesive bonding or other suitable joining method of skirt portion 24 causes frame portion 106 thereof to form optional substantially watertight seal 108 with peripheral edge portion 104 of interior window portion 22. Optionally, frame portion 106 of skirt portion 24 overlaps interior window portion 22 thereof on either one or both (shown) of an outer surface 110 thereof and an inner surface 112 thereof.

PVC, silicone or other resiliently pliable skirt portion 24 includes continuous pliable seal 54 positioned between peripheral rim 16 of lid 14 and peripheral rim 44 of tray 12 that, when lid 14 is in the closed position relative to tray 12, is compressed between substantially rigid rim 16 of lid 14 and substantially rigid peripheral rim 44 of tray 12 for forming a continuous substantially water-resistant seal around the touch screen device within protective enclosure 10, as disclosed herein. Optionally, seal 54 is formed with preload portion 56 that expands evenly between hinge and clamping ends of lid rim 14 to a peak thickness near the midpoint of lid rim 14, as more clearly illustrated in FIG. 4, and insures that seal 54 will form a continuous substantially water-resistant seal between rim 16 of lid 14 and tray 12.

Overmolding or other suitable joining of pliable skirt portion 24 with interior window portion 22 results in protective membrane 20 being substantially a single, unitary one-piece unit that includes: continuous pliable seal portion 54, substantially transparent noncompressible interior window portion 22 that is adapted to allow tactile inputs to be communicated to the touch screen of the device in protective enclosure 10, and pliable, soft and compressible skirt portion 24 that is joined thereto along edge portion 104 thereof and extended from interior window portion 22, and wherein skirt portion 24 is adapted to allow tactile inputs to be communicated to one or more actuators on sides and/or ends of the touch screen device case.

Peripheral seal portion 54 is disposed along the entire circumference of protective membrane 20 at edge of pliable skirt portion 24 opposite from interior window portion 22, wherein peripheral seal portion 54 of membrane 20 is formed as a sealing lip of an increased thickness of membrane 20 relative to membrane skirt portion 24 and interior window portion 22. As disclosed herein, peripheral sealing lip portion 54 of membrane 20 is configured and arranged to be at least partially disposed within first circumferential barrier 64 to form a water-resistant seal. For example, membrane peripheral sealing lip portion 54 includes first contact surface 68 defining a first circumferential barrier formed as a ridge extending around the circumference of membrane skirt portion 24, which is sized and arranged to be at least partially received into first circumferential barrier groove 64 of lid rim 16 entirely around circumference of viewing aperture 18 of lid 14. Peripheral sealing lip portion 54 of membrane 20 is further configured and arranged to receive rim 16 of lid 14 at least partially thereinto. For example, as disclosed herein, membrane peripheral sealing lip portion 54 includes second contact surface 70 defining a groove extending around circumference of membrane skirt portion 24, which is sized and arranged to receive thereinto second circumferential barrier ridge 66 of lid rim 16 entirely around circumference of viewing aperture 18 of lid 14.

Also, as disclosed herein, peripheral sealing lip portion 54 of protective membrane 20 is configured and arranged to form a water-resistant seal between peripheral rim 16 of lid 14 and peripheral rim 44 of tray 12. Peripheral rim 44 of tray 12 is configured and arranged to cooperate with seal retention means 62 of lid rim 16 for at least partially compressing pliable seal 54 of membrane 20 therebetween for forming a continuous substantially water-resistant seal around the touch screen device within protective enclosure 10, as disclosed herein.

As disclosed herein, peripheral sealing lip portion 54 of protective membrane 20 is formed with third contact surface 72 defining a first circumferential compression interface formed as a ridge extending around the circumference of membrane skirt portion 24 and extending therefrom entirely around circumference of rim 16 of lid 14. Peripheral sealing lip portion 54 of membrane 20 is further formed with fourth contact surface 74 disposed adjacent to third contact surface 72 and defining a second circumferential compression interface formed as a flat surface aligned within first circumferential compression interface ridge 72.

Peripheral first circumferential compression barrier groove 76 of tray rim 44 is sized and arranged to at least partially receive compressively thereinto first circumferential compression interface ridge 72 of peripheral sealing lip portion 54 of membrane 20 to form a continuous water-resistant seal between peripheral rim 16 of lid 14 and peripheral rim 44 of tray 12. Furthermore, peripheral second circumferential compression barrier flat contact surface 78 is further sized and arranged within first circumferential barrier groove 76 to at least partially receive compressively there against second circumferential compression interface flat surface 74 of peripheral sealing lip portion 54 of membrane 20 to form a continuous water-resistant seal between peripheral rim 16 of lid 14 and peripheral rim 44 of tray 12.

As disclosed herein, peripheral sealing lip portion 54 of membrane 20 optionally includes membrane positioning means 80 for positioning protective membrane 20 in viewing aperture 18. By example and without limitation, membrane peripheral sealing lip portion 54 is formed with circumferential groove 82 and lip 84 fit over inner peripheral ledge 86 of lid peripheral rim 16 within viewing aperture 18. Here, lip 84 is optionally wider for a more secure joint with inner peripheral ledge 86 inside viewing aperture 18 within peripheral rim 16 of lid 14.

While the preferred and additional alternative embodiments of the invention have been illustrated and described, it will be appreciated that various changes can be made therein without departing from the spirit and scope of the invention. Therefore, it will be appreciated that various changes can be made therein without departing from the spirit and scope of the invention. Accordingly, the inventor makes the following claims.

What is claimed is:

1. A protective enclosure for a device responsive to a tactile stimulus, the enclosure allowing operation of the device while the device is disposed in the enclosure, the enclosure comprising:
    a tray comprising an interior device seating area and a rim around the device seating area, the tray adapted for receiving the device on the device seating area and oriented with a portion thereof responsive to a tactile input facing away from the device seating area; and
    a lid movable relative to the device seating area of the tray between an open position and a closed position, the lid comprising:
        a rim around a viewing aperture, the aperture positioned for viewing an interior of the enclosure there through,
        a substantially transparent inelastic sheet forming a viewing window, and
        a resiliently pliable skirt projected from the viewing aperture of the lid and bonded to the viewing window, the skirt projecting the viewing window outwardly of the rim around the aperture of the lid;
    a continuous pliable seal positioned between the rim of the lid and the rim of the tray when the lid is in the closed position relative to the tray; and
    wherein the enclosure comprises a protective case portion adapted to hold a touch screen device and allowing operation of the touch screen and of one or more actuators on a side of the touch screen device, and wherein the device seating area of the tray is further adapted to position at least a portion of the touch screen device outwardly of the rim of the lid and through the aperture thereof, with the touch screen of the touch screen device and the one or more actuators thereof being positioned substantially outwardly of the rim of the lid and through the aperture thereof when the lid is in the closed position relative to the tray.

2. The protective enclosure of claim 1, further comprising a clamping mechanism structured for clamping the pliable seal between the rim of the lid and the rim of the tray.

3. The protective enclosure of claim 2, wherein the clamping mechanism is further structured for clamping the pliable seal between the rim of the lid and the rim of the tray in a continuous substantially water-resistant seal.

4. The protective enclosure of claim 2, wherein the lid is further hinged relative to the device seating area of the tray for moving between the open position and the closed position.

5. The protective enclosure of claim 1, further comprising a substantially watertight seal between the skirt and the viewing window.

6. The protective enclosure of claim 5, wherein the substantially watertight seal further comprises a substantially continuous joint between the skirt and a peripheral edge portion of the viewing window.

7. The protective enclosure of claim 1, further comprising a joint between the skirt and the viewing window, the joint comprising one of: an over-molded joint, an ultra-sonic weld joint, a chemical weld joint, and an adhesive bond joint.

8. The protective enclosure of claim 1, wherein the substantially transparent inelastic sheet forming the viewing window further comprises a hard and noncompressible plastic membrane.

9. The protective enclosure of claim 8, wherein the hard and noncompressible plastic membrane further comprises one of: a polyethylene terephthalate (PET) membrane, and a polyvinyl chloride (PVC) material; and wherein the skirt further comprises a polyvinyl chloride (PVC) material.

10. The protective enclosure of claim 1, wherein the skirt further comprises the pliable seal.

11. The protective enclosure of claim 1, wherein the device seating area of the tray is further projected outwardly of the rim thereof.

12. An enclosure for a touch screen device that allows operation of a touch screen on the touch screen device while the touch screen device is disposed in the enclosure, the enclosure comprising:
    a shell that is adapted to contain the touch screen device;
    an aperture in the shell in such a position as to be disposed over the touch screen of the touch screen device when the touch screen device is disposed in the enclosure;

a protective membrane sized for substantially filling the aperture in the shell, the protective membrane comprising:
  a continuous pliable seal portion,
  a noncompressible interior viewing and operating window panel that is adapted to allow tactile inputs to be communicated to the touch screen, and
  a compressible skirt portion formed of a substantially transparent polyvinyl chloride (PVC) material joined between the seal portion and the interior window panel, the skirt portion spacing the interior window panel outwardly of the aperture in the shell and away from the shell that is adapted to contain the touch screen device, and the skirt portion being adapted to allow tactile inputs to be communicated to one or more actuators on a side of the touch screen device;
the protective membrane adapted to mount in the aperture with the interior window panel and skirt portion thereof and being projected outwardly of the aperture in the shell; and
wherein the shell comprises a protective case portion adapted to hold the touch screen device and allowing operation of the touch screen and of one or more actuators on sides of the touch screen device through the interior window panel and skirt portions of the protective membrane.

13. The enclosure of claim 12, wherein the skirt of the protective membrane is further joined to the interior window panel and forms a substantially watertight seal with a peripheral edge portion thereof.

14. The enclosure of claim 12, wherein the interior window panel of the protective membrane further comprises a hard and inelastic plastic sheet.

15. The enclosure of claim 14, wherein the inelastic plastic sheet of the interior window panel further comprises a polyvinyl chloride (PVC) material.

16. The enclosure of claim 12, wherein the shell further comprises a tray and a lid, wherein the aperture is further formed in the lid, and wherein the lid is movable between an open position and a closed position relative to the tray.

17. An enclosure for a touch screen device that allows operation of a touch screen on the touch screen device while the touch screen device is disposed in the enclosure, the enclosure comprising:
  a shell that is adapted to contain the touch screen device;
  an aperture in the shell in such a position as to be disposed over the touch screen of the touch screen device when the touch screen device is disposed in the enclosure;
  a protective membrane sized for substantially filling the aperture in the shell, the protective membrane comprising:
    a continuous pliable seal portion,
    a noncompressible interior viewing and operating window panel that is adapted to allow tactile inputs to be communicated to the touch screen, and
    a compressible skirt portion formed of a polyvinyl chloride (PVC) material joined between the seal portion and the interior window panel and being adapted to allow tactile inputs to be communicated to one or more actuators on a side of the touch screen device;
  the protective membrane adapted to mount in the aperture with the interior window panel and skirt portion thereof and being projected outwardly of the aperture in the shell; and wherein the shell comprises a protective case portion adapted to hold the touch screen device and allowing operation of the touch screen and of one or more actuators on sides of the touch screen device through the interior window panel and skirt portions of the protective membrane, and
  wherein the tray further comprises an interior device seating surface and a rim around the device seating surface, the tray adapted for receiving the touch screen device on the device seating surface and oriented with a portion thereof responsive to a tactile input facing away from the device seating surface, the tray further adapted for projecting the touch screen device at least partially outwardly of the aperture in the shell with the touch screen portion being exposed outwardly of the aperture in the shell within the protective membrane, and the one or more actuators on the side of the touch screen device being at least partially exposed outwardly of the aperture in the shell within the protective membrane for allowing operation of the touch screen and of one or more actuators on sides of the touch screen device through the protective membrane.

18. The enclosure of claim 17, wherein the lid further comprises a rim around the aperture, the rim substantially corresponding to the rim of the tray, and wherein the seal portion of the protective membrane is further positioned between the rim of the lid and the rim of the tray when the lid is in the closed position relative to the tray.

19. The enclosure of claim 18, further comprising a clamping mechanism structured for compressing the pliable seal between the rim of the lid and the rim of the tray.

* * * * *